United States Patent
Jang et al.

(10) Patent No.: US 7,710,211 B2
(45) Date of Patent: May 4, 2010

(54) INJECTION-LOCKED FREQUENCY DIVIDER WITH A WIDE INJECTION-LOCKED FREQUENCY RANGE

(75) Inventors: Sheng-Lyang Jang, Taipei (TW); Chien-Feng Lee, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 138 days.

(21) Appl. No.: 12/003,881

(22) Filed: Jan. 3, 2008

(65) Prior Publication Data

US 2009/0085682 A1 Apr. 2, 2009

(30) Foreign Application Priority Data

Sep. 29, 2007 (TW) ............................. 96136621 A

(51) Int. Cl.
*H03B 5/08* (2006.01)
(52) U.S. Cl. ............. 331/167; 331/117 FE; 331/117 R; 331/116 R; 331/116 FE; 331/177 V
(58) Field of Classification Search ........... 331/117 FE, 331/117 R, 116 R, 116 FE, 167, 177 V
See application file for complete search history.

(56) References Cited

U.S. PATENT DOCUMENTS 5,396,195 A * 3/1995 Gabara .................... 331/113 R
6,317,008 B1 * 11/2001 Gabara .................... 331/117 R
2007/0257742 A1 * 11/2007 Cha et al. .................... 331/167

OTHER PUBLICATIONS

Author: Marc Tiebout Title: A CMOS Direct Injection-Locked Oscillator Topology as High-Frequency Low-Power Frequency Divider Date: Jul. 2004 Publisher, Volume: IEEE Journal of Solid-State Circuits, vol. 39, No. 7, Jul. 2004.*
Author: Marc Tiebout Title: A CMOS Direct Injection-Locked Oscillator Topology as High-Frequency Low-Power Frequency Divider Date: Jul. 2004 Publisher: IEEE Journal of solid-state circuits vol. 39, No. 7.*
Auther: Chien-Feng Lee, Sheng-Lyang Jang, M.-H. Juang Title: A wide locking range differential colpitts injection locked frequency divider Date: Nov. 2007 Publisher: IEEE Microwave and Wireless Component Letters vol. 17, No. 11.*

* cited by examiner

*Primary Examiner*—Arnold Kinkead
*Assistant Examiner*—Richard Tan
(74) *Attorney, Agent, or Firm*—Bacon & Thomas, PLLC

(57) ABSTRACT

An injection-locked frequency divider includes a signal injection circuit and colpitts VCO. The signal injection circuit is for injecting an injection signal. The colpitts VCO includes first and second transistors, first and second LC tank circuits and a cross-coupled transistor pair. The first terminals of the first and second transistors receive the injection signal. The first and second LC tank circuits are for determining resonance frequency of an oscillation signal of the colpitts VCO. The cross-coupled transistor pair includes third and fourth transistors. The control terminals of the third and fourth transistors are respectively coupled to first terminals of the fourth and third transistors. The first terminals of the third and fourth transistors are respectively coupled to a first terminal or control terminal of the first and second transistors for providing an equivalent negative resistance. The injection signal and oscillation signal are mixed in frequency to generate differential output signals.

10 Claims, 4 Drawing Sheets

US 7,710,211 B2

INJECTION-LOCKED FREQUENCY DIVIDER WITH A WIDE INJECTION-LOCKED FREQUENCY RANGE

This application claims the benefit of Taiwan application Ser. No. 96136621, filed Sep. 29, 2007, the subject matter of which is incorporated herein by reference.

BACKGROUND OF THE INVENTION

1. Field of the Invention

The invention relates in general to an injection-locked frequency divider, and more particularly to an injection-locked frequency divider with a wide injection-locked frequency range.

2. Description of the Related Art

The frequency divider is one of the indispensable and essential components in the present wireless communication system, which is used for receiving an original signal and reducing the frequency of the signal by dividing it by one or a number of different values.

The injection-locked frequency divider is a commonly-used high frequency divider, which integrates a signal injection unit and a voltage controlled oscillator (VCO), such as a LC tank oscillator to divide the frequency of an injection signal.

However, the conventional injection-locked frequency divider has a very narrow injection-locked frequency range. If the injection signal has a frequency falling outside the injection-locked frequency range of the injection-locked frequency divider due to process or temperature variation, the injection-locked frequency divider will have malfunction. Therefore, how to design an injection-locked frequency divider with a wide injection-locked frequency range is a target for the relevant industrials to be engaged in.

SUMMARY OF THE INVENTION

The invention is directed to an injection-locked frequency divider including a colpitts VCO with a LC tank circuit. The injection-locked frequency divider of the invention can change a resonance frequency of an oscillation signal of the colpitts VCO by adjusting a tunable voltage. Therefore, the injection-locked frequency divider of the invention has a wide tunable resonance frequency range, which can effectively improve the injection-locked frequency range.

According to the present invention, an injection-locked frequency divider is provided. The injection-locked frequency divider comprises a signal injection circuit and a colpitts voltage controlled oscillator (VCO). The signal injection circuit is for injecting an injection signal. The colpitts VCO comprises a first transistor and a second transistor, a first LC tank circuit and a second LC tank circuit and a cross-coupled transistor pair. Each of the first transistor and second transistor comprises a first terminal for receiving the injection signal and a second terminal coupled to an operational voltage. The first LC tank circuit and second LC tank circuit are respectively disposed across a control terminal and the first terminal of the first transistor and the second transistor for determining a resonance frequency of an oscillation signal of the colpitts VCO. The cross-coupled transistor pair comprises a third transistor and a fourth transistor. The control terminals of the third transistor and the fourth transistor are respectively coupled to first terminals of the fourth transistor and the third transistor. The first terminals of the third transistor and the fourth transistor are respectively coupled to a first terminal or control terminal of the first transistor and the second transistor for providing an equivalent negative resistance to cancel a loss of parasitic equivalent resistance in the first LC tank circuit and the second LC tank circuit and outputting a pair of differential output signals at the first terminals of the third transistor and the fourth transistor. The injection signal and the oscillation signal are mixed in frequency to generate the pair of differential output signals.

The invention will become apparent from the following detailed description of the preferred but non-limiting embodiments. The following description is made with reference to the accompanying drawings.

DETAILED DESCRIPTION OF THE INVENTION

The injection-locked frequency divider of the invention includes a signal injection circuit and a colpitts VCO. The signal injection circuit is for injecting an injection signal. The colpitts VCO includes a first transistor and a second transistor, a first LC tank circuit and a second LC tank circuit, and a cross-coupled transistor pair. Each of the first transistor and second transistor includes a first terminal for receiving the injection signal and a second terminal coupled to an operational voltage. The first LC tank circuit and second LC tank circuit are respectively disposed across a control terminal and the first terminal of the first transistor and the second transistor for determining a resonance frequency of an oscillation signal of the colpitts VCO.

The cross-coupled transistor pair includes a third transistor and a fourth transistor. Control terminals of the third transistor and the fourth transistor are respectively coupled to first terminals of the fourth transistor and the third transistor, the first terminals of the third transistor and the fourth transistor are respectively coupled to a first terminal or control terminal of the first transistor and the second transistor for providing an equivalent negative resistance and outputting a pair of differential output signals at the first terminals of the third transistor and the fourth transistor.

The injection signal and the oscillation signal are mixed in frequency to generate the above differential output signals.

Figure 1:
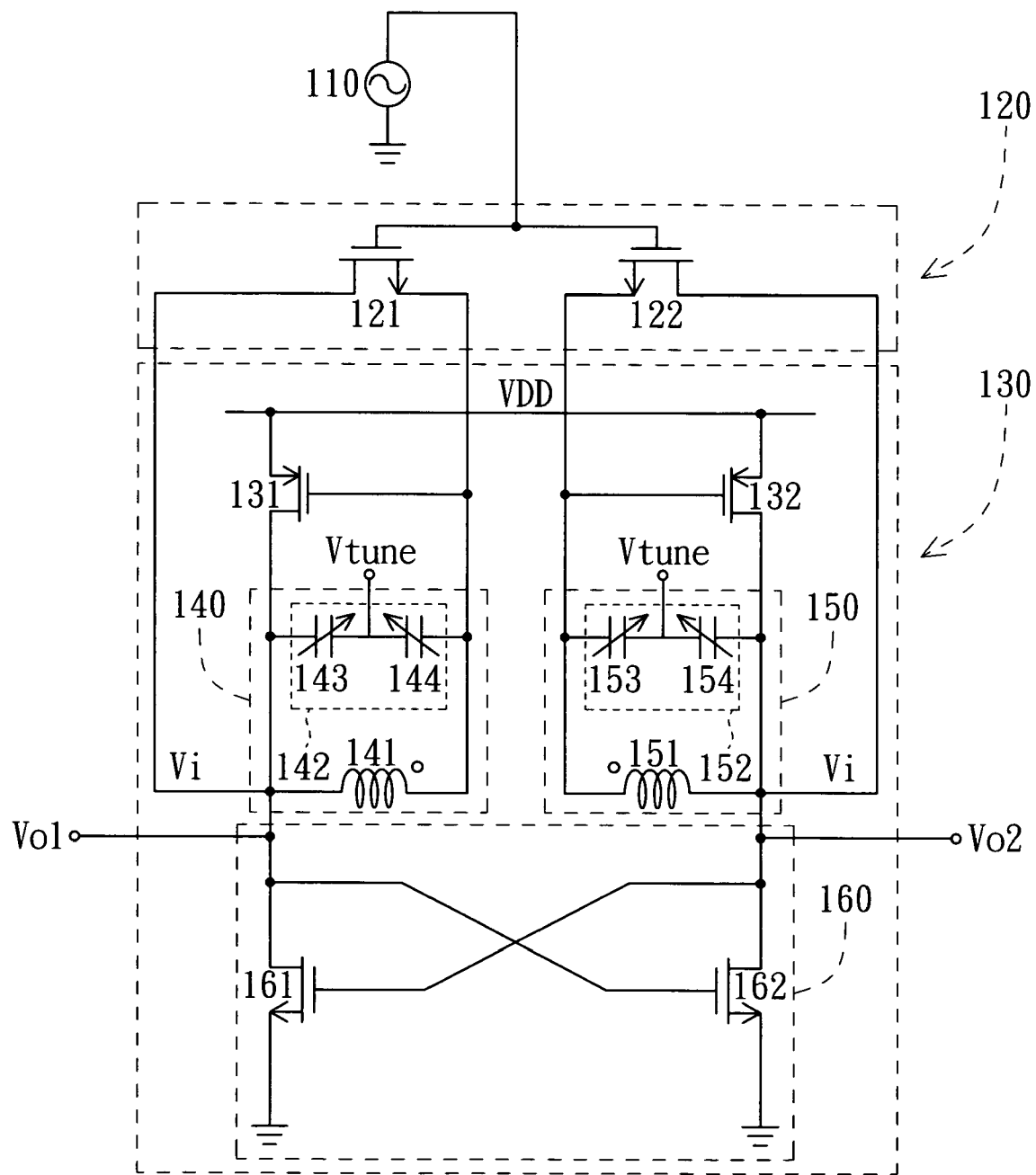
FIG. 1 is a circuit diagram of an injection-locked frequency divider according to a preferred embodiment of the invention.

Referring to FIG. 1, a circuit diagram of an injection-locked frequency divider according to a preferred embodiment of the invention is shown. An injection-locked frequency divider 100 includes a signal injection circuit 120 and a colpitts VCO 130. The signal injection circuit 120 is used for injecting an injection signal Vi. The colpitts VCO 130 is used for receiving the injection signal Vi and outputting a pair of differential output signals Vo1 and Vo2. The differential output signals Vo1 and Vo2 have divided frequency fd.

In the embodiment of the invention, the injection circuit 120 includes transistors 121 and 122. The transistors 121 and 122 are exemplified to be N-type metal oxide semiconductors (NMOS) for illustration. Each of the transistors 121 and 122 has a gate coupled to an injection signal source 110 and a source and a drain for outputting the injection signal Vi corresponding to the injection signal source 110.

In the embodiment of the invention, the colpitts VCO 130 includes transistors 131 and 132, LC tank circuits 140 and 150 and a cross-coupled transistor pair 160. In the embodiment of the invention, the injection signal Vi is injected to the drains and gates of the transistors 131 and 132 and is mixed in frequency with the oscillation signal of the colpitts VCO 130. The sources of the transistors 131 and 132 receive an operational voltage VDD.

The LC tank circuit 140 is disposed across the gate and drain of the transistor 131, while the LC tank circuit 150 is disposed across the gate and drain of the transistor 132. The LC tank circuits 140 and 150 are used for determining the resonance frequency fo (free running) of the oscillation signal of the colpitts VCO 130.

In the embodiment of the invention, the LC tank circuit 140 includes an inductance 141 and a capacitance circuit 142 connected in parallel between the gate and drain of the transistor 131. The LC tank circuit 150 includes an inductance 151 and a capacitance circuit 152 connected in parallel between the gate and drain of the transistor 132. The capacitance of the capacitance circuits 142 and 152 is determined in response to a tunable voltage Vtune in order to determine the resonance frequency fo of the oscillation signal of the colpitts VCO 130.

In the embodiment of the invention, the capacitance circuit 142 includes varactors 143 and 144 connected to each other in series. The capacitance circuit 152 includes varactors 153 and 154 connected to each other in series. The capacitance of the varactors 143, 144, 153 and 154 is determined in response to the tunable voltage Vtune so as to determine the resonance frequency fo. In the embodiment of the invention, by applying the varactors 143, 144, 153 and 154, the tunable range of the resonance frequency fo of the colpitts VCO 130 can be effectively increased.

The cross-coupled transistor pair 160 includes transistors 161 and 162. A drain of the transistor 161 is coupled to a gate of the transistor 162, while a drain of the transistor 162 is coupled to a gate of the transistor 161. The drains of the transistors 161 and 162 are coupled to the drains of the transistors 131 and 132. The cross-coupled transistor pair 160 is used for providing an equivalent negative resistance to cancel a loss of parasitic equivalent resistance in the LC tank circuits 140 and 150. By canceling the above equivalent resistance, the oscillation signal of the colpitts VCO 130 can keep oscillating.

Besides, by applying the cross-coupled transistor pair 160, the colpitts VCO 100 can receive the injection signal from a single injection signal source 110, and accordingly output the differential output signals Vo1 and Vo2. When the gate of the transistor 161 has a high level, the transistor 161 is turned on. At the time, the drain voltage of the transistor 161 is the output voltage Vo1, which has a low level. Conversely, when the gate voltage of the transistor 161 has a low level, the output voltage Vo1 has a high level. The gate and drain voltages of the transistor 161 are opposite in phase. Similarly, the gate and drain voltages of the transistor 162 are opposite in phase. Owing that the drain of the transistor 162 is coupled to the gate of the transistor 161, and the drain of the transistor 161 is coupled to the gate of the transistor 162, the drain voltage of the transistor 162, i.e. the output voltage Vo2, has a phase opposite to that of the drain voltage of the transistor 161, i.e. the output voltage Vo1. Therefore, the injection-locked frequency divider of the embodiment can receive the injection signal from a single signal source and accordingly output a pair of differential output signals with opposite phases.

Therefore, after the injection signal Vi is injected into the colpitts VCO 130, the injection signal Vi is mixed in frequency with the oscillation signal having the resonance frequency fo to generate the differential output signals Vo1 and Vo2. In the embodiment of the invention, when the injection signal Vi has a frequency fi about N times the resonance frequency fo of the oscillation signal of the colpitts VCO 130, that is, when the frequency fi of the injection signal Vi falls in the injection-locked frequency range corresponding to a N-time frequency of the resonance frequency fo, the injection-locked frequency divider 100 can divide the frequency of the injection signal Vi and output the differential output signals Vo1 and Vo2 with a divided frequency substantially equal to 1/N of the frequency of the injection signal Vi, wherein N is a positive integer.

Figure 2:
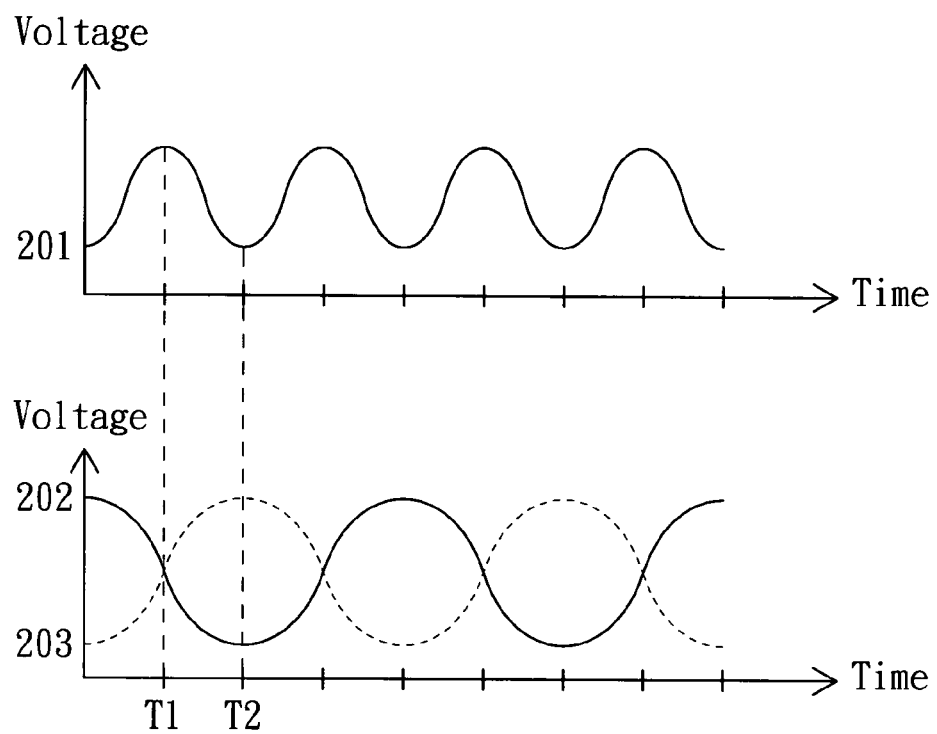
FIG. 2 is a waveform diagram of the injection signal of the injection-locked frequency divider and the voltages of the differential output signals and relative to time according to the preferred embodiment of the invention.

In the following description, the frequency fi of the injection signal Vi is exemplified to fall in the injection-locked frequency range corresponding to double-frequency of the resonance frequency for illustrating the relation between the injection signal Vi and the differential output signals Vo1 and Vo2 outputted after frequency mixture. FIG. 2 is a waveform diagram of the injection signal Vi of the injection-locked frequency divider 100 and the voltages of the differential output signals Vo1 and Vo2 relative to time according to the preferred embodiment of the invention. The waveform 201 is a waveform of the injection signal Vi while the waveforms 202 and 203 are respectively waveforms of the differential output signals Vo1 and Vo2. The waveforms 202 and 203 have opposite phases.

The transistors 121 and 122 are turned on or turned off in response to the injection signal source 110. At the time T1, the injection signal Vi has a high level, such that the transistors 121 and 122 are turned on. At the time, the transistors 161 and 162 have the same drain voltage. That is, the differential output voltages Vo1 and Vo2 are equal. Therefore, at the time T1, when the waveform 201 has the high level, the corresponding voltage of the waveforms 202 and 203 in FIG. 2 is equal.

When the injection signal Vi is not at the high level such that the transistors 121 and 122 are turned off, the drain voltages of the transistors 161 and 162 of the cross-coupled transistor pair have opposite phases. That is, when the waveform 201 does not have the high level, the waveforms 202 and 203 have phases opposite to each other.

For example, at the time T2 when the injection signal Vi has the low level, the transistors 121 and 122 are turned off. At the time, the drain voltages of the transistors 161 and 162 have opposite phases. That is, the differential output voltages Vo1 and Vo2 are equal. Therefore, at the time T2, the waveforms 202 and 203 of FIG. 2 have opposite phases.

The waveforms 201, 202 and 203 at other time points have the same relation as mentioned above, whose details are not necessary to be given here.

Therefore, from FIG. 2, it can be seen that the period of the waveform 201 is two time-units. The period of the waveforms 202 and 203 is four time-units. That is, the frequency of the waveforms 202 and 203 is a half of that of the waveform 201. In other words, the divided frequency fd of the differential output signals Vo1 and Vo2 is a half of the frequency fi of the injection signal Vi. The signal injection circuit 120 locks the differential output signals Vo1 and Vo2 so that the wave peaks/bottoms of the differential output signals Vo1 and Vo2 are synchronized with the wave peaks/bottoms of the injection signal Vi.

Therefore, when the resonance frequency fi of the injection signal Vi falls in the injection-locked frequency range of the injection-locked frequency divider 100, the differential output signals Vo1 and Vo2 outputted by the injection-locked frequency divider 100 has a divided frequency substantially equal to a half of the frequency fi of the injection signal Vi.

The effect of the injection-locked frequency divider of the embodiment of the invention is illustrated in the following description. The injection-locked frequency divider of the embodiment of the invention adjusts the resonance frequency of the colpitts VCO 130 by using the LC tank circuits 140 and 150. Each of the LC tank circuits 140 and 150 includes an inductance and two varactors, wherein the inductance is connected to the varactors in parallel. Therefore, the injection-locked frequency divider 100 of the embodiment of the invention has a wide tunable resonance-frequency range. Owing that the injection-locked frequency range is approximately centered by the resonance frequency of the oscillator thereon, when the tunable resonance-frequency range is very wide, the injection-locked frequency range is also very wide.

Besides, the injection-locked frequency divider of the embodiment of the invention uses the LC tank circuits 140 and 150 which respectively include the inductance 141 and 151 as the feedback circuits. Furthermore, the capacitance circuit 142 of the LC tank circuit 140 is connected in parallel to the parasitic capacitor between the gate and source and the parasitic capacitor between the drain and base of the transistors 131 and 161, and thus the equivalent capacitance of the colpitts VCO 130 can be effectively reduced. As a result, the injection-locked frequency divider of the embodiment of the invention can further increase the injection-locked frequency range.

In addition, the injection-locked frequency divider 100 of the embodiment of the invention has a symmetric circuit structure. The transistors 121 and 122 of the signal injection circuit 120 are symmetric to each other. In the colpitts VCO 130, the transistors 131 and 132, the LC tank circuits 140 and 150, the transistors 161 and 162 are all symmetric pairs. Therefore, by increasing the symmetry of the circuit structure, the injection-locked frequency divider 100 of the embodiment of the invention can further increase the injection-locked frequency range.

The injection-locked frequency divider 100 of the embodiment of the invention outputs the differential output signals Vo1 and Vo2 and thus can suppress the noise in common mode.

Besides, the transistors 131 and 132 are P-type metal oxide semiconductors (PMOS), which can further reduce phase noise of the injection-locked frequency divider.

In the embodiment of the invention, the frequency fi of the injection signal Vi is exemplified to fall in the injection-locked frequency range corresponding to the double frequency of the resonance frequency fo for illustration, and thus the differential output signals Vo1 and Vo2 outputted by the injection-locked frequency divider 100 have the divided frequency fd equal to a half of the frequency fi of the injection signal. However, in practical applications, when the frequency fi of the injection signal Vi falls in the injection-locked frequency range of the injection-locked frequency divider 100 corresponding to the N-time frequency of the resonance frequency fo, the differential output signals Vo1 and Vo2 outputted by the injection-locked frequency divider 100 have frequency substantially equal to 1/N of the frequency fi of the injection signal Vi, wherein N is a positive integer.

Although the transistors 161 and 162 are exemplified to be the metal oxide semiconductor (MOS) transistors, in practical applications, the transistors 161 and 162 can also be replaced by bipolar junction transistors.

Figure 3:
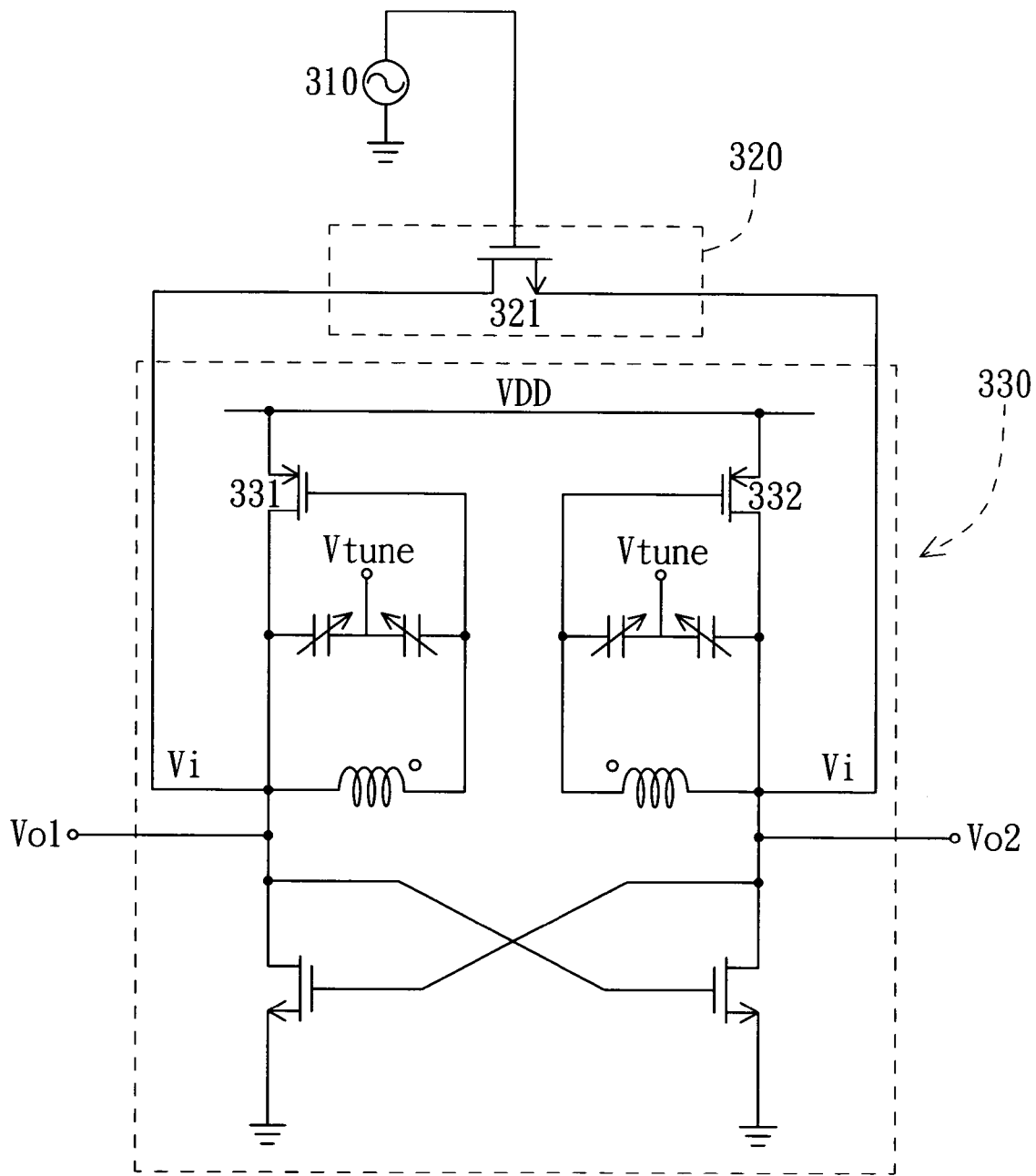
FIG. 3 is another example of the injection-locked frequency divider according to the embodiment of the invention.

In the embodiment of the invention, the signal injection circuit 120 is exemplified to include the transistors 121 and 122, and the injection signal Vi is exemplified to be injected to the drains and gates of the transistors 131 and 132. However, the invention is not limited thereto. FIG. 3 shows another example of the injection-locked frequency divider of the embodiment of the invention. Different from the injection-locked frequency divider of FIG. 1, the injection-locked frequency divider 300 of FIG. 3 includes a signal injection circuit 320 having only a transistor 321. The transistor 321 includes a gate coupled to an injection signal source 310, a drain and a source respectively coupled to gates of transistors 331 and 332 of a colpitts VCO 330 for injecting the injection signal Vi to the colpitts VCO 330.

Figure 4:
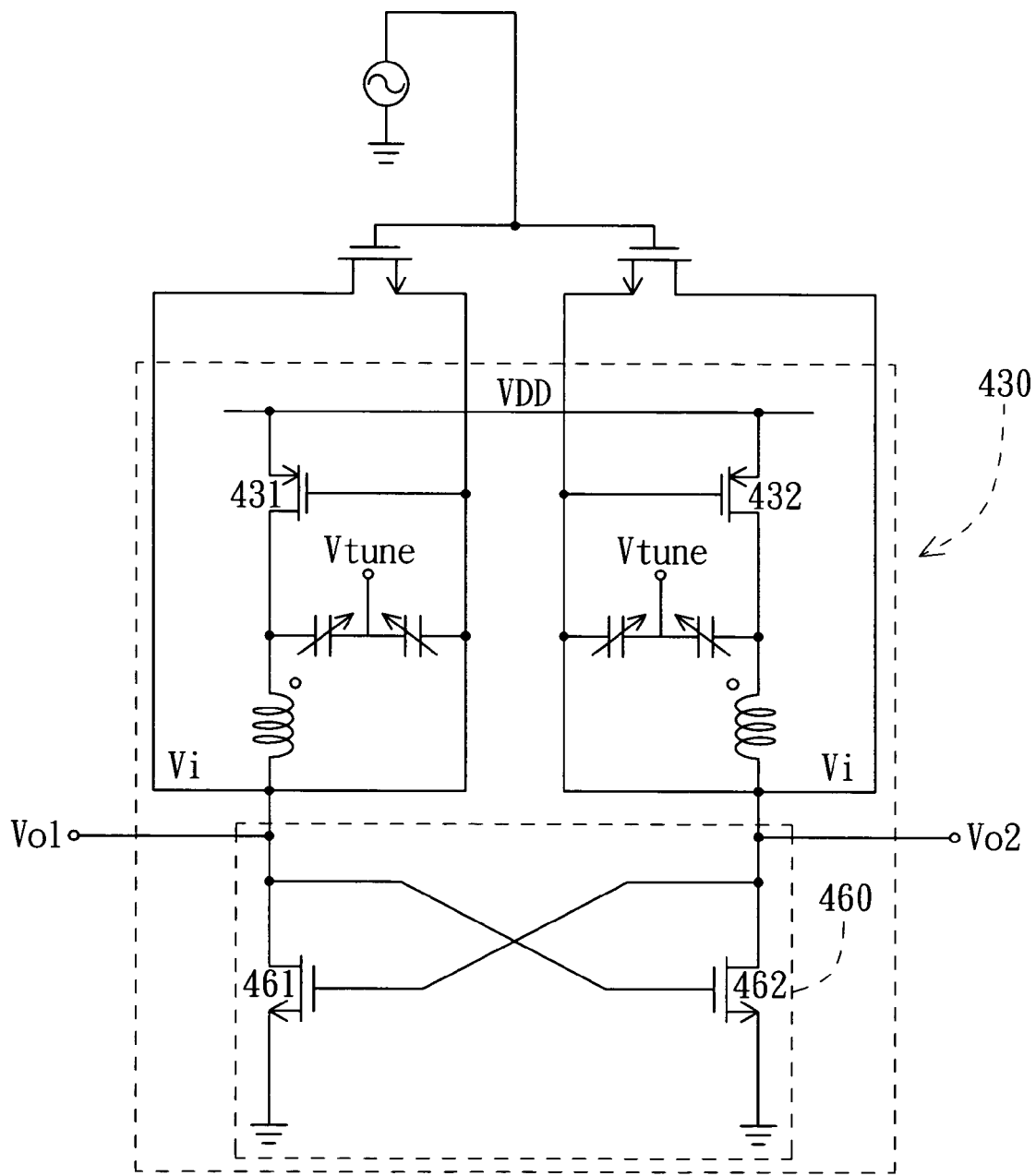
FIG. 4 is another example of the injection-locked frequency divider according to the embodiment of the invention.

In the injection-locked frequency divider 300 of FIG. 1, the drain and gate of the transistor 161 of the cross-coupled transistor pair 160 are exemplified to be coupled to the drains of the transistors 131 and 132, and the drain and gate of the transistor 162 are exemplified to be coupled to the drains of the transistors 132 and 131. However, in practical applications, the invention is not limited thereto. FIG. 4 shows another example of the injection-locked frequency divider according to the embodiment of the invention. In the colpitts VCO 430 of the injection-locked frequency divider 400 of FIG. 4, the drain and gate of the transistor 461 of the cross-coupled transistor pair 460 are respectively coupled to the gates of the transistors 431 and 432, while the drain and gate of the transistor 462 are respectively coupled to the gates of the transistor 432 and 431. The drains of the transistors 461 and 462 output the differential output signals Vo1 and Vo2.

The injection-locked frequency divider of the embodiment of the invention uses the colpitts VCO with a LC tank circuit and can adjust the resonance frequency of the oscillation signal of the colpitts VCO by changing a tunable voltage. Therefore, the injection-locked frequency divider of the embodiment of the invention has a wide tunable resonance frequency range, and can effectively improve its injection-locked frequency range. Besides, the circuit of the injection-locked frequency divider of the invention has symmetric structure, which can also effectively increase its injection-locked frequency range. At the same time, by outputting the differential output signals, the injection-locked frequency divider of the embodiment of the invention can further effectively suppress the noise in common mode.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An injection-locked frequency divider, comprising:
   a signal injection circuit, coupled to an injection signal source, injecting an injection signal; and
   a colpitts voltage controlled oscillator (VCO), comprising:
      a first transistor and a second transistor, each comprising a first terminal for receiving the injection signal and a second terminal coupled to an operational voltage;
      a first LC tank circuit and a second LC tank circuit, respectively disposed across a control terminal and the first terminal of the first transistor and the second transistor for determining a resonance frequency of an oscillation signal of the colpitts VCO; and
      a cross-coupled transistor pair, comprising a third transistor and a fourth transistor, wherein control terminals of the third transistor and the fourth transistor are respectively coupled to first terminals of the fourth transistor and the third transistor, the first terminals of the third transistor and the fourth transistor are respectively coupled to a first terminal or control terminal of the first transistor and the second transistor for providing an equivalent negative resistance to cancel a loss of parasitic equivalent resistance in the first LC tank circuit and the second LC tank circuit and outputting a pair of differential output signals at the first terminals of the third transistor and the fourth transistor;

wherein the injection signal and the oscillation signal are mixed in frequency to generate the pair of differential output signals, the signal injection circuit further locking the pair of differential output signals.

2. The injection-locked frequency divider according to claim 1, wherein when the frequency of the injection signal belongs to an injection-locked frequency range corresponding to a N-time frequency of the resonance frequency, the pair of differential output signals outputted by the injection-locked frequency divider has substantially a frequency equal to 1/N of the frequency of the injection signal, and N is a positive integer.

3. The injection-locked frequency divider according to claim 1, wherein the signal injection circuit comprises a fifth transistor and a sixth transistor, gates of the fifth transistor and the sixth transistor receive the injection signal source corresponding to the injection signal, the fifth transistor comprises a first terminal and a second terminal respectively coupled to the control terminal and the first terminal of the first transistor, the sixth transistor comprises a first terminal and a second terminal respectively coupled to the control terminal and the first terminal of the second transistor so as to inject the injection signal into the colpitts VCO.

4. The injection-locked frequency divider according to claim 3, wherein the fifth transistor and the sixth transistor are N-type or P-type metal oxide semiconductor (MOS) transistors.

5. The injection-locked frequency divider according to claim 1, wherein the signal injection circuit comprises a fifth transistor, the fifth transistor comprises a gate for receiving the injection signal source corresponding to the injection signal and a first terminal and a second terminal respectively coupled to the first terminal of the first transistor and the second transistor to inject the injection signal.

6. The injection-locked frequency divider according to claim 1, wherein the third transistor and the fourth transistor are MOS transistors or bipolar junction transistors.

7. The injection-locked frequency divider according to claim 1, wherein each of the first LC tank circuit and the second LC tank circuit comprises a capacitance circuit and an inductance, the capacitance circuit and the inductance of the first LC tank circuit are connected in parallel between the control terminal and the first terminal of the first transistor, the capacitance circuit and the inductance of the second LC tank circuit are connected in parallel between the control terminal and the first terminal of the second transistor, and the capacitance of the capacitance circuit is determined in response to an tunable voltage in order to determine the resonance frequency of the colpitts VCO.

8. The injection-locked frequency divider according to claim 7, wherein each of the capacitance circuits of the first and the second LC tank circuits comprises a first varactor and a second varactor, the first varactor and the second varactor are connected to each other in series and capacitance of the first varactor and the second varactor is determined in response to the tunable voltage in order to determine the resonance frequency of the colpitts VCO.

9. The injection-locked frequency divider according to claim 1, having a symmetric circuit structure.

10. The injection-locked frequency divider according to claim 1, wherein the signal injection circuit locks the pair of the differential output signals, so that wave peaks and/or bottoms of the pair of the differential output signals are synchronized with wave peaks and/or bottoms of the injection signal.

* * * * *